US012787166B2

(12) United States Patent
Kippes et al.

(10) Patent No.: US 12,787,166 B2
(45) Date of Patent: Nov. 3, 2026

(54) OPTOELECTRONIC ASSEMBLY AND METHOD FOR THE PRODUCTION OF SAME

(71) Applicant: ams-OSRAM International GmbH, Regensburg (DE)

(72) Inventors: Thomas Kippes, Neumarkt (DE); Joerg Erich Sorg, Regensburg (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 195 days.

(21) Appl. No.: 18/561,274

(22) PCT Filed: May 17, 2022

(86) PCT No.: PCT/EP2022/063299

§ 371 (c)(1),
(2) Date: Nov. 15, 2023

(87) PCT Pub. No.: WO2022/243298

PCT Pub. Date: Nov. 24, 2022

(65) Prior Publication Data

US 2024/0260186 A1 Aug. 1, 2024

(30) Foreign Application Priority Data

May 17, 2021 (DE) ..................... 10 2021 112 740.8

(51) Int. Cl.

*H05K 1/11* (2006.01)
*H05K 3/00* (2006.01)
*H05K 3/341* (2026.01)

(52) U.S. Cl.

CPC ........... *H05K 1/111* (2013.01); *H05K 3/0061* (2013.01); *H05K 3/341* (2013.01); *H05K 2201/10121* (2013.01); *H05K 2203/1173* (2013.01)

(58) Field of Classification Search

CPC ......... H05K 1/111; H05K 2201/10121; H05K 1/0274; H05K 1/113; H05K 1/116;
(Continued)

(56) References Cited

U.S. PATENT DOCUMENTS

2001/0032985 A1 10/2001 Bhat et al.
2008/0118251 A1* 5/2008 Itamoto ................ H01S 5/0235 257/E23.184

(Continued)

FOREIGN PATENT DOCUMENTS

DE 10221504 A1 11/2002
DE 102008025599 A1 1/2009

(Continued)

OTHER PUBLICATIONS

Zimmer, R. (Authorized officer), International Search Report and Written opinion dated Sep. 19, 2022, PCT Application No. PCT/EP2022/063299, 13 pages (including English translation).

*Primary Examiner* — Timothy J Thompson
*Assistant Examiner* — Sidi M Maiga
(74) *Attorney, Agent, or Firm* — MH2 Technology Law Group LLP

(57) ABSTRACT

The invention relates to an optoelectronic assembly with an optoelectronic component with two or more connecting contacts for feeding supply and/or control signals. A housing with a two-dimensional structured underside has two or more solder pads which are each surrounded by a non-wettable region, wherein the solder pads are guided through the underside of the housing and are connected to the plurality of connecting contacts. Furthermore, the underside of the housing comprises two or more solder surfaces which are each surrounded by a non-wettable region. The two or
(Continued)

more solder pads and the solder surfaces are thereby substantially uniformly distributed over the underside of the housing.

15 Claims, 4 Drawing Sheets

(58) Field of Classification Search
CPC .......... H05K 2201/09481; H05K 2201/09563; H05K 2201/10242; H05K 2201/10287; H05K 2201/10719; H05K 3/445
See application file for complete search history.

(56) References Cited

U.S. PATENT DOCUMENTS

| | | | | |
|---|---|---|---|---|
| 2008/0283991 | A1* | 11/2008 | Reinert | B81B 7/007 257/E23.18 |
| 2016/0204574 | A1 | 7/2016 | Schwartz et al. | |
| 2019/0035972 | A1 | 1/2019 | Zitzlsperger et al. | |
| 2020/0203604 | A1* | 6/2020 | Pillarisetty | H10B 63/30 |
| 2020/0287111 | A1 | 9/2020 | Schwarz et al. | |
| 2021/0399518 | A1 | 12/2021 | Schwarz et al. | |

FOREIGN PATENT DOCUMENTS

| | | | |
|---|---|---|---|
| DE | 102016101526 | A1 | 8/2017 |
| DE | 102017128457 | A1 | 6/2019 |
| DE | 102018129343 | A1 | 5/2020 |
| WO | 2015032603 | A1 | 3/2015 |

* cited by examiner

OPTOELECTRONIC ASSEMBLY AND METHOD FOR THE PRODUCTION OF SAME

CROSS-REFERENCE TO RELATED APPLICATIONS

The present application is a national stage entry from International Application No. PCT/EP2022/063299, filed on May 17, 2022, published as International Publication No. WO 2022/243298 A1 on Nov. 24, 2022, and claims the priority of German application DE 10 2021 112 740.8 filed May 17, 2021, the disclosure content of all of which are hereby incorporated by reference in their entireties.

FIELD

The present invention relates to an optoelectronic assembly and a method of making the same.

BACKGROUND

In many optoelectronic components and electronic components in general, these are provided with a housing, with the terminal contacts—also referred to as connection pins—arranged on a bottom side of the housing. For attachment to a printed circuit board, PCB, the electronic components are aligned with their housing and then placed on the PCB. In a subsequent soldering process, an existing solder is melted so that the individual terminal contacts on the underside of the housing are connected to corresponding terminal pads on the PCB. Depending on the manufacturing technique, a certain amount of solder is already present on the PCB or the underside of the housing, or this solder is provided during the soldering process.

However, depending on the housing geometry used and especially with very large terminal contacts on the underside of the housing, capillary and other effects can occur so that the housings are not symmetrically and parallel aligned with respect to the PCB. In addition to the resulting—in some applications—disadvantageous tilting, short circuits can also occur between individual terminal contacts on the underside of the housing. Reducing the amount of solder can help in some cases, but this cannot be reduced arbitrarily without causing contact problems or thermal coupling problems.

Accordingly, there is a need to provide housings that can be soldered sufficiently well regardless of the arrangement of the terminal contacts on the underside of the housing, so that the problems with regard to possible tilting or possible short circuits are reduced.

SUMMARY OF THE INVENTION

This need is met by the objects of the independent claims. Further developments and advantageous designs are the subject of the subclaims.

The inventors propose an optoelectronic assembly comprising a package and an electronic component disposed therein. The component may be an IC, an optoelectronic device, or a combination thereof. Multiple ICs, devices, or other elements may be housed within the package. The electronic component comprises two or more terminal contacts for supplying supply and/or control signals.

The housing may include a cover attached to a housing base. In some aspects, the housing is also integrally formed. The lower housing portion is formed with a planar textured lower housing surface. In accordance with the invention, the housing underside includes two or more solder contact pads each surrounded by a non-wettable region, the solder contact pads extending through the housing underside and being connected to the plurality of terminal contacts of the device. In addition, the housing bottom comprises two or more solder contact pads, each surrounded by a non-wettable region. In this regard, it is provided according to the invention that the solder contact pads and the solder areas are uniformly distributed on the underside of the housing so that there are no large whole-area areas that can be wetted by solder. By large whole-area areas are meant solder-wettable areas whose size is substantially larger than that of the other solder areas or solder contact pads and, in particular, occupies a large portion of the total area of the underside of the housing. In other words, the ratio of an area of a solder area or solder contact pad compared to the area of the underside of the housing is significantly smaller and is at most 45%. This ensures that the area of the bottom surface of the housing is divided into smaller areas, so that a solder material is distributed over a plurality of solder areas and solder contact pads that are separated from each other. This reduces the adverse effects mentioned at the beginning, or causes them along or in different parts of the underside of the housing, thereby compensating for each other.

Typical problems that occur when soldering assemblies for surface mounting are thus reduced or avoided altogether.

It should also be pointed out again at this point the difference between a solder area and a solder contact pad. Both surfaces basically serve to have solder material deposited on them in order to obtain, in some aspects, the most uniform distribution of solder material possible to compensate for the disadvantages mentioned at the beginning. However, a solder area has only a mechanical or thermal functionality, while a solder contact pad further comprises an electrical functionality. In other words, solder contact pads enable an electrical contact to a component on the other side, while the solder areas are either so-called blind areas or are only intended to form a contact to a reference potential. In addition, the solder areas can also serve a thermal, i.e. a transport of waste heat, so that they also transport away heat generated during operation in addition to the solder contact pads.

In some aspects, in order to achieve uniform and consistent positioning of the solder areas and the solder contact pads, it is provided that the underside of the housing is subdivided into a virtual grid of rows and columns. Thereby, according to the invention, a solder contact pad or a solder area is now arranged in a virtual grid field defined by the subdivision. Such a virtual subdivision is useful because it makes it particularly easy to achieve a uniform arrangement of the solder contact pads or the solder areas. In some aspects, the virtual grid fields formed in this manner are of equal size. However, it is also possible for rows and/or columns to be of different sizes, in which case it is convenient to select the grid fields of a row and/or column to be of equal size in each case. Furthermore, a certain symmetry of the raster field should be ensured, i.e. larger raster fields of a column should not be provided only along one edge of the bottom side of the housing. Different sizes of the grid fields are useful if solder areas and solder contact pads have different sizes.

In some aspects, an area of a virtual grid array comprises 1 to 1.75 times an area, in particular 1 to 1.4 times an area, of the solder area disposed in the virtual grid array and the surrounding non-wettable area or solder contact pad and the surrounding non-wettable area. In this context, each grid field either contains a respective solder area or solder contact pad with the respective non-wettable areas or is empty.

In some aspects, the two or more solder contact pads and the two or more solder areas each comprise the same size. However, it is also possible for them to be different sizes, while still being smaller than or equal to an area of a virtual grid array. In one aspect, it is provided that surfaces of the same size are arranged in the same row or the same column.

In another aspect, the shape and size of the solder contact pads is addressed. In some aspects, the two or more solder contact pads comprise the same shape. Similarly, the two or more solder contact pads may also comprise a different shape with respect to the solder contact pads. This may be appropriate when the solder areas are primarily for heat dissipation, but are not to carry current or other signals. In these aspects, the solder areas may also comprise a different size with respect to the solder contact pads. In another aspect, the solder contact pads are round and the solder areas are square.

In some aspects, the solder areas and the solder contact pads with their wettable area of a solder area or solder contact pad are significantly smaller than total area of the bottom surface of the housing. For example, the area of a solder area or solder contact pad may be in the range of 5% to 20%, but more particularly in the range of 7.5% to 15%, and most particularly in the range less than 12% of the total area of the underside of the housing.

In some aspects, the housing base includes a metallic layer on the underside of the housing as a heat sink. It may also be formed with a metallic block, or comprise a lead frame or similar metallic structure.

The two or more solder areas are then patterned on the underside of the housing. To this end, in some aspects, the solder areas may form protrusions formed by stamping, embossing, etching, or even via electroplating processes. In some aspects, the non-wettable regions surrounding the solder areas are formed with a solder resist. In other aspects, these areas are formed by removing the solder-wettable metal layer to expose a non-wettable layer. This can also be a metallic layer, but can also be an insulating layer.

In some aspects, the solder areas form a portion of the bottom surface of the housing. In such a case, they are planar with the package bottom surface and in some aspects comprise the same metal layer as the rest of the package bottom surface. In other aspects, the metal layer of the surface is formed by a thin gold layer only a few 10 nm or 100 nm thick. In the non-wettable areas surrounding the solder areas, the gold layer is removed. A special non-wettable layer may then be applied to these. Alternatively, the layer underlying the gold layer may comprise non-wettable properties such that liquid solder is repelled and attracts onto the solder area. Examples of this would be a solder-repellent metal, for example nickel, lying under the gold layer forming the surface.

In another aspect, the solder areas and/or the solder contact pads each comprise planar elevations extending across the underside of the housing. The non-wettable areas surrounding the solder areas are formed by the edge of the planar elevations, wherein optionally the metal layer wettable by solder, in particular gold, may be removed at the edge. Alternatively, a non-wettable material such as solder resist, glass or plastic can be adjacent to the edge. The planar protrusions may be in the range of 50 μm to 500 μm, particularly in the range of 100 μm to 300 μm. In aspects where the solder areas and or the solder contact pads are formed as elevations, the interstices may be formed with an insulating underfill material. this material may improve thermal coupling and be applied only after a soldering process. This prevents the soldering process from being impaired by the underfill material. At the same time, capillary effects can be exploited so that the underfill material flows into the gaps between the assembly and PCB after a soldering process.

Another aspect relates to a method of manufacturing such an assembly. In this, a housing having a planar housing underside and at least two solder contact pads arranged on the housing underside and surrounded by a non-wettable region is provided. The housing underside is subdivided into a plurality of first and second subregions, in particular subregions of equal size. The subdivision is such that a respective solder contact pad with the surrounding non-wettable region is located in a first of the plurality of subregions. In other words, the subregions can thus be defined as a function of the solder contact pads already present. Alternatively, these steps may be reversed so that the solder contact pads are formed in first previously defined sub-regions. The virtual grid areas described above can be understood as such partial areas.

Then, solder areas are created in second ones of the plurality of partial areas. Non-wettable areas are provided around the respective solder areas so that one solder area and the non-wettable area surrounding the solder area are each located within the respective second partial area. According to the invention, the first and second partial areas are substantially uniformly distributed on the underside of the housing.

In some aspects, it may be convenient to make the solder areas and the solder contact pads substantially equal in size, respectively. Similarly, no wettable area of a solder area or solder contact pad should exceed 40% of a total area of the bottom surface of the housing. In particular, the area of a solder area or solder contact pad may be within the ranges disclosed above.

In some aspects, the non-wettable regions around the solder areas and/or the solder contact pads are formed by forming a solder stop coating around the solder areas and/or solder contact pads. Alternatively, a glass layer may be provided around the solder contact pads. The solder contact pads may be contact pins surrounded by a glass cylinder and pass through the bottom of the housing. Further alternatively, the non-wettable areas around the solder pads and/or the solder contact pads may be formed removing the wettable metallic surface in the edge region around the solder pads and/or solder contact pads so as to expose an underlying non-wettable layer of the housing base.

In subsequent steps, the assembly is positioned on and soldered to a PCB. Then, in some aspects, a viscous underfill material can be applied around the assembly on the PCB so that it flows by capillary forces into gaps between the assembly and the PCB. This improves thermal coupling and prevents water or moisture accumulation in the interstices.

BRIEF DESCRIPTION OF THE DRAWINGS

Further aspects and embodiments according to the proposed principle will become apparent with reference to the various embodiments and examples described in detail in connection with the accompanying drawings.

DETAILED DESCRIPTION

The following embodiments and examples show various aspects and their combinations according to the proposed principle. The embodiments and examples are not always to scale. Likewise, various elements may be shown enlarged or reduced in size to highlight individual aspects. It will be understood that the individual aspects and features of the embodiments and examples shown in the figures may be readily combined with each other without affecting the principle of the invention. Some aspects comprise a regular structure or shape. It should be noted that minor deviations from the ideal shape may occur in practice, but without contradicting the inventive idea.

In addition, the individual figures, features and aspects are not necessarily shown in the correct size, nor do the proportions between the individual elements have to be fundamentally correct. Some aspects and features are highlighted by showing them enlarged. However, terms such as "above", "above", "below", "below", "larger", "smaller" and the like are correctly represented in relation to the elements in the figures. Thus, it is possible to derive such relationships between the elements based on the figures. However, the proposed principle is not limited herein, but different optoelectronic devices, with different size and also functionality can be used in the invention. In the embodiments, elements with the same or similar effects are shown with the same reference signs.

Figure 1:
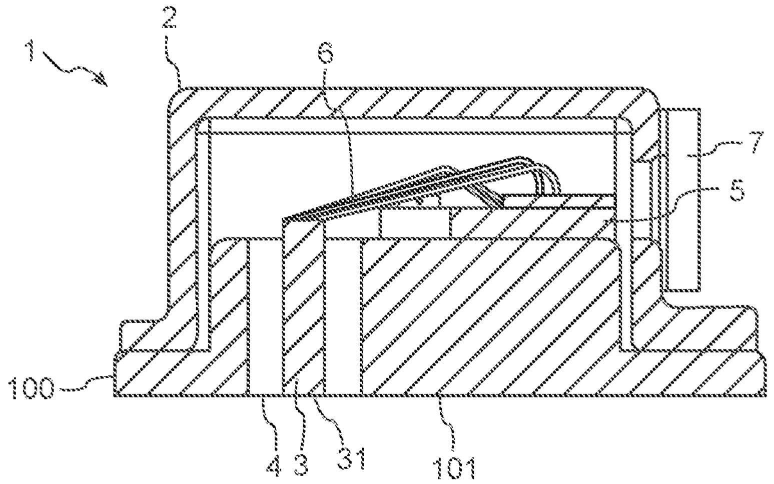
FIG. 1 shows a first embodiment of an optoelectronic assembly in cross-sectional view.

FIG. 1 shows in cross-sectional view an optoelectronic component in a housing as a so-called optoelectronic assembly. The assembly comprises a housing cover 2 which is glued to or otherwise attached to a lower housing part 100. In this embodiment example, the lower housing part 100 is made of a metal block or a material with very good thermal conductivity and comprises a planar surface 101. Furthermore, a plurality of recesses are provided in the lower housing part with the lower housing side 101, in each of which a contact pin 3 surrounded by an insulating material 4 is inserted. The underside 31 of the contact pin 4 adjacent to the housing underside 101 forms a solder contact pad surrounded by the insulating material 4. The insulating material 4 is made of glass, for example, and thus forms a non-wettable region surrounding the solder contact pad 31. The term non-wettable is understood to mean a material or the surface of a material that is repellent to solder, so that liquid solder does not deposit there. Glass is usually non-wettable to a Sn-based solder or other solder, i.e. liquid solder will, if at all possible, stay away from such a surface, or flow onto an adjacent wettable surface. A non-wettable surface is thus solder-repellent, while a wettable surface is solder-attractive.

The glass 4 is guided together with the contact pin 3 through the lower housing part 100 and is guided inside the housing via one or more bonding wires 6 to terminal contacts of an electronic component 5. In the present embodiment, the electronic component 5 forms an edge-emitting reader which emits light towards the side in the direction of an outcoupling optics 7. In this respect, the housing cover 2 is thus provided with an opening in which the outcoupling optics 7 are arranged.

Depending on the embodiment, the underside of the housing 101 has a large surface area. This means that its total area is significantly larger than the area of the contact pin 3 formed by the solder contact pad 31.

Figure 2:
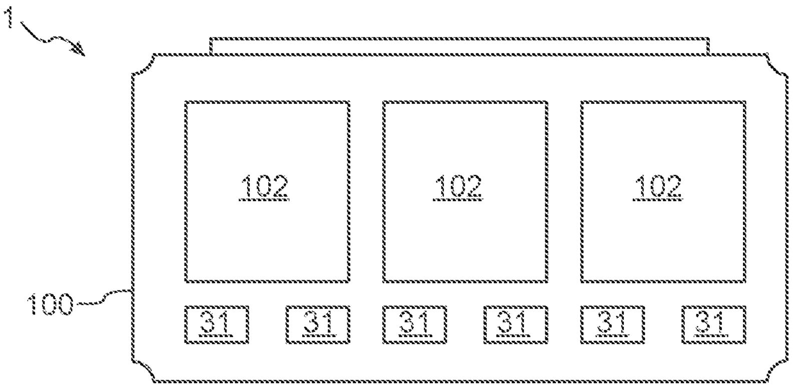
FIG. 2 shows a second embodiment of an optoelectronic assembly in a top view of the underside of the housing.

FIG. 2 shows a top view of the underside of a conventional housing 1. In this embodiment, which is slightly different from the conventional embodiment in FIG. 1, the housing comprises a total of 6 solder contact pads 31 arranged in pairs. Furthermore, 3 additional solder areas 102 are provided, which serve as heat sinks for thermal connection of the component to a PCB.

In both embodiments, it is noticeable that the soldering areas 102 or 101 are shaped significantly differently in size from the respective solder contact pads. In a soldering process, this can lead to solder material accumulating primarily in the large-area region 102 or 101 due to capillary or other effects, resulting in tilting there. If, moreover, the component is only approximately positioned, as is quite common in conventional processes, and is then to "float in" via capillary effects of the solder, i.e. position itself correctly in a self-organizing manner due to the capillary effects, insufficient or even incorrect alignment may occur due to the different surfaces. In addition, it can happen that solder accumulating on one side leads to a short circuit.

The inventors therefore propose to provide approximately equally sized areas on a package underside to be wetted with solder to improve the process. Instead of the large-area underside of the housing shown in FIG. 1 or the large solder areas 102 shown in FIG. 2, the underside of the housing of an electronic assembly is divided according to the proposed principle into a virtual grid of rows Rz and columns Rx. In each of these virtual grid fields $R_F$, or in a symmetrical subset thereof, either individual solder areas or solder contact pads are now arranged. The grid fields are of equal size, so that a solder area or solder contact pad is arranged in each grid field $R_F$. In addition, individual grid fields can remain free, but the virtual grid fields filled with solder areas or solder contact pads should be distributed as evenly as possible over the underside of the housing.

Figure 3:
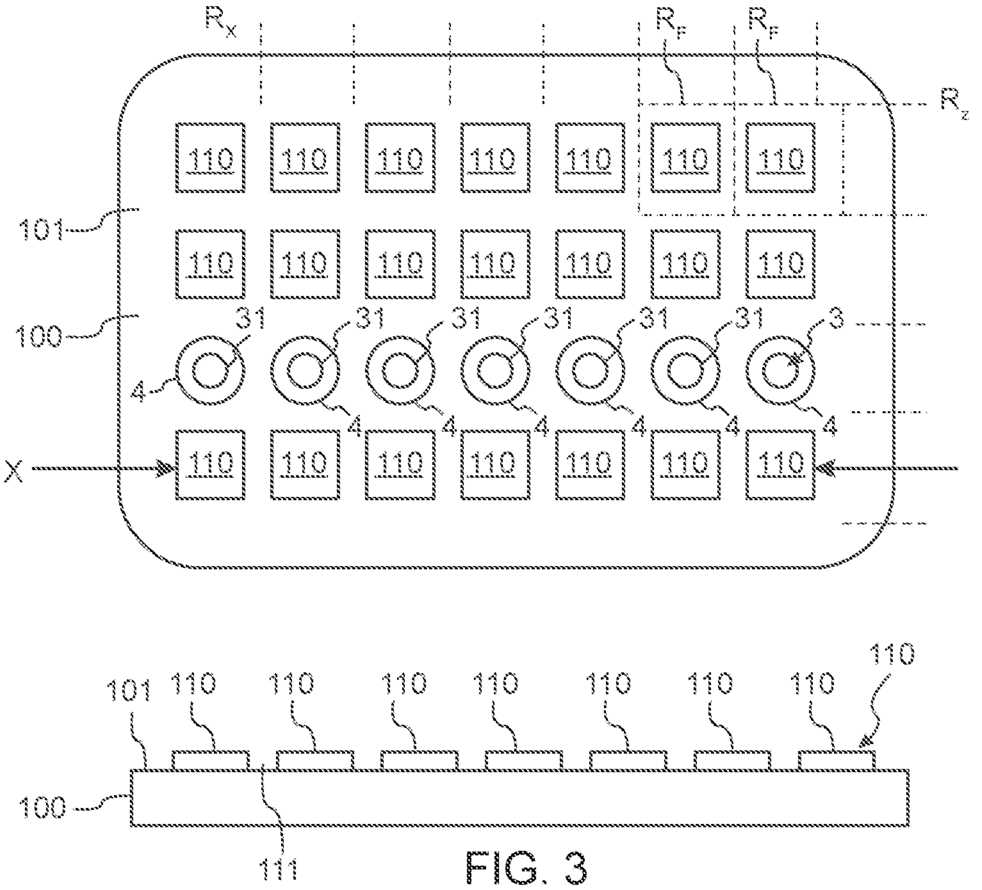
FIG. 3 presents a third embodiment of an assembly to explain various aspects of the proposed principle.

In FIG. 3, the base side of the housing is divided into a total of 28 grid areas $R_F$ in a 7×4 matrix. The solder areas 110 and the solder contact pads 31 with the surrounding areas 4 are now arranged in this matrix. Solder contact pads 31 and solder areas 110 are arranged as uniformly as possible, preferably also symmetrically, on the underside of the housing so that approximately equal forces are exerted on the component by the liquid solder during a process. In the example, all solder contact pads 31 form a row.

This improves floating of the assembly in liquid solder due to the capillary forces present and positions it on the corresponding contacts of the PCB in a self-organizing manner. At the same time, tilting due to an accumulation of larger amounts of solder on one side is reduced.

FIG. 3 shows an embodiment of such an electronic assembly in which the bottom surface of the housing is textured to achieve the desired effect. In this case, the assembly comprises a housing with a housing underside 101. The housing underside 101 is metallic and comprises a plurality of solder pads 110 arranged in rows and columns along the virtual grid. The solder pads 110 are applied as metallic elevations symmetrically in a plurality of rows and columns on the housing underside 101. The elevations may be made directly from the material of the housing, for example by non-cutting or cutting, for example by stamping, embossing, etching, milling or sawing. Alternatively, it is equally possible to manufacture the solder areas 110 by means of a suitably structured mask and a subsequent electrodeposition process. Other manufacturing methods are also conceivable as required.

In addition, there are several solder contact pads 31, each of which is surrounded by a non-wettable area 4. The solder contact pads 31 form the surface of the terminal contacts 3 which lead into the interior of the housing and are connected there to the terminal contacts of the electronic component. Like the soldering areas 110, contact areas 31 can be produced galvanically or in another way.

The solder contact pads 31 are guided through the lower housing part 100 via contact pins, i.e. feedthroughs, and are guided inside the housing to terminal contacts of an electronic component via one or more bonding wires. In this way, the solder contact pads 31 contact a component mounted on the other side. In contrast, the solder areas 110 are designed as so-called blind solder areas, i.e. they do not assume any electrical or electronic function with respect to the component on the other side. However, as already explained, they can be used to dissipate some of the heat generated during operation.

As shown in the lower partial figure of FIG. 3 as a section along line X, the solder areas 110 form cuboidal protrusions extending over the surface 101 of the underside of the housing. Between them are spaces 111 The height is from a few 10 μm to a few 100 μm. In a talking soldering process, a small amount of solder is now applied to the individual solder areas 110 and the solder contact pads 31, and the assembly is then positioned. As the solder liquefies, it collects along the individual solder areas 110 and generally distributes evenly over the solder areas 110 and the solder contact pads 31. By dividing the bottom surface 101 of the housing into a virtual grid and then arranging the areas 110 and 31 within the individual grid areas to be wetted with solder, a more even distribution of solder occurs across the bottom surface of the housing. In particular, the amount of solder contained on the solder pads and the solder contact pads is substantially equal, so that no imbalance occurs and this leads to tilting or short circuits between the solder contact pads 31.

In the embodiment example of FIG. 3, the solder areas 110 are formed by elevations, whereby the solder experiences a natural barrier and boundary at their respective edges. In this respect, the edges of the solder areas 110 form non-wettable areas which surround the wettable areas of the solder areas 110, i.e. their respective inner surfaces. Accordingly, non-wettable areas 4 of glass, for example, surround the solder contact pads 31.

Figure 4:
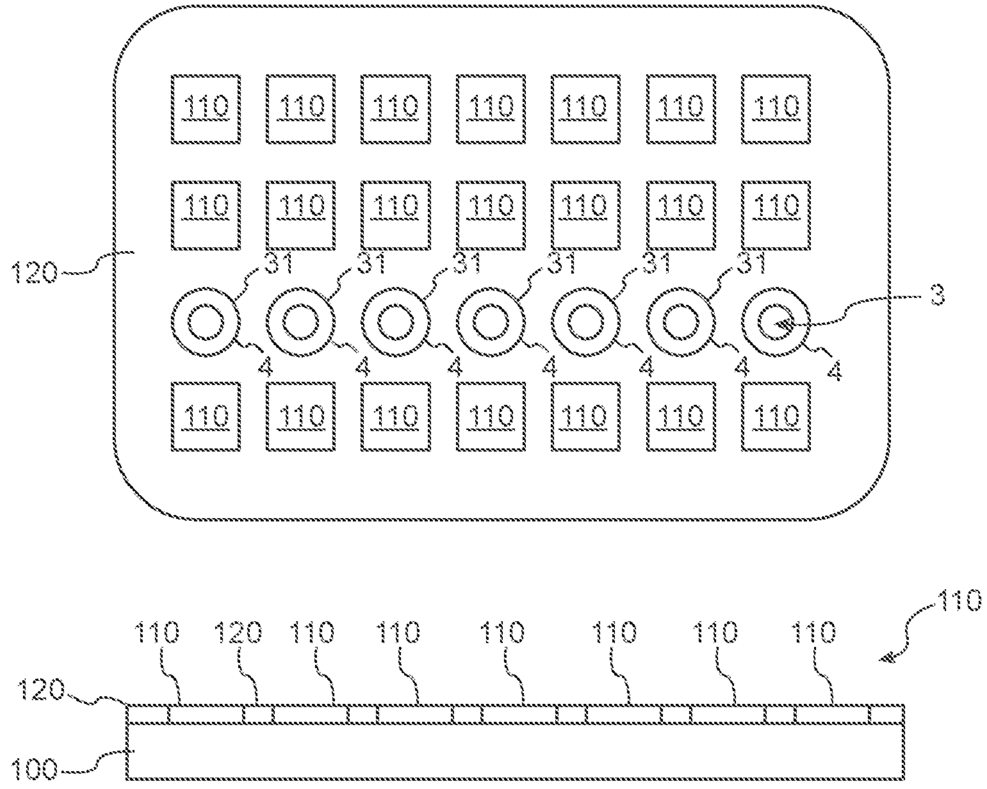
FIG. 4 forms another embodiment to explain some aspects of the proposed principle.

In a further embodiment, an additional solder resist can be provided between the individual solder areas 110 or also the adjacent non-wettable areas 4. Such an arrangement is shown in FIG. 4. In this embodiment, an additional stop varnish 120 is additionally spun on in the spaces between the individual solder areas 110 and closes flush with the surface of the areas 110 and the solder contact pads 31. In a corresponding soldering process, the solder resist 120 prevented solder material from accumulating between the individual solder areas 110. Instead, the applied solder material distributes substantially evenly over the individual solder areas 110 and the solder contact pads 31, resulting in plane-parallel alignment of the assembly while maintaining good thermal and electrical contact.

Figure 5:
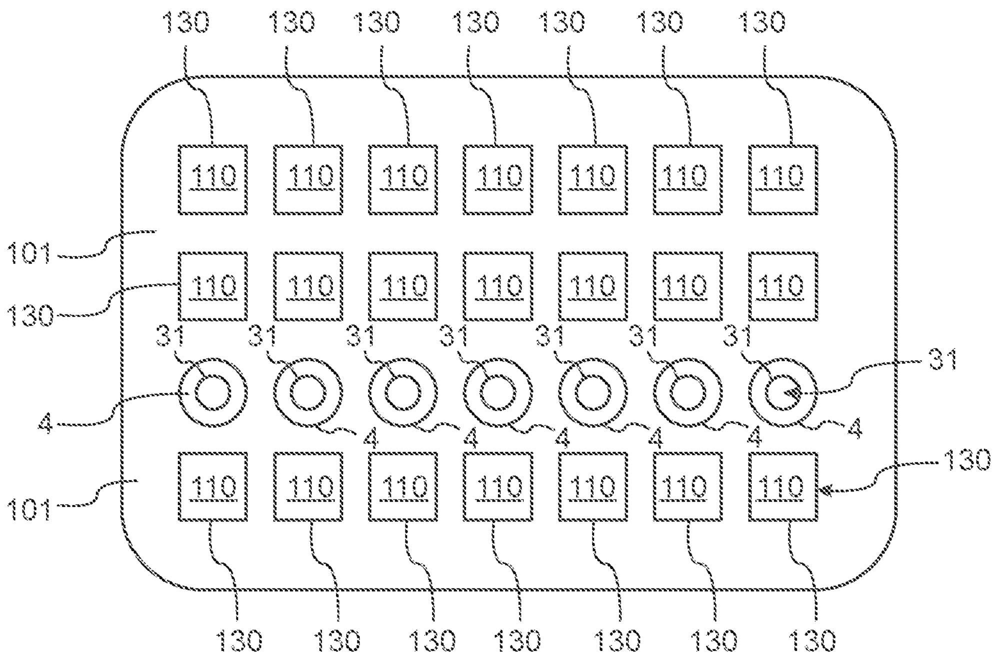
FIG. 5 shows an embodiment of a housing underside according to some further aspects of the proposed principle.

FIG. 5 shows another embodiment in which the non-wettable regions around the individual solder areas 110 are formed in a manner different from the previous embodiments. In this embodiment, the individual solder areas 110 are planar with the entire bottom surface 101 of the housing. Moreover, the surface of the bottom surface 101 of the housing and the surface of the solder areas 110 may be formed of the same material.

To create and produce the individual solder areas 110, an area between the underside of the housing and the solder areas 110 is now slightly removed, resulting in the edge areas 130 shown in FIG. 5. The solder areas 110 are thus defined by the edge areas where the solderable material has been removed. In the present embodiment, the bottom surface 101 of the housing may be provided with a thin gold coating. Meanwhile, the edge regions 130 surrounding the solder pads 110 are free of gold coating and the underlying material, in particular a non-wettable material is exposed. This results in a natural solder stop layer through the areas 130 surrounding the solder areas 110, so that in a subsequent soldering process the solder material does not extend beyond this boundary and wet the remaining underside of the housing. In this case, the surrounding exposed areas 130 can also be designed to be significantly wider so that the non-wettable surrounding areas are sufficiently wide.

In an alternative aspect, during fabrication of the housing according to the invention, the bottom surface 101 of the housing is covered with a photomask, patterned, and the corresponding solder areas 110 are coated with gold or other material wettable by solder. Subsequently, after a removal of the photomask, the surrounding areas 130 are created using a laser writing process or other processes. In such an embodiment, the solder areas 110 would thus form low elevations based on the deposition process of the bottom surface 101 of the housing. The surrounding areas represent the edges of these areas 110.

In the previous embodiments, a certain symmetry is provided by the distribution of the solder areas and the solder contact pads due to the subdivision of the grid. In a corresponding soldering process, tilting or other interference is avoided by subdividing the entire underside of the housing into various individual areas to be soldered. However, it is also possible to arrange the individual solder contact pads not in a line, but at different positions depending on requirements and design.

Figure 6:
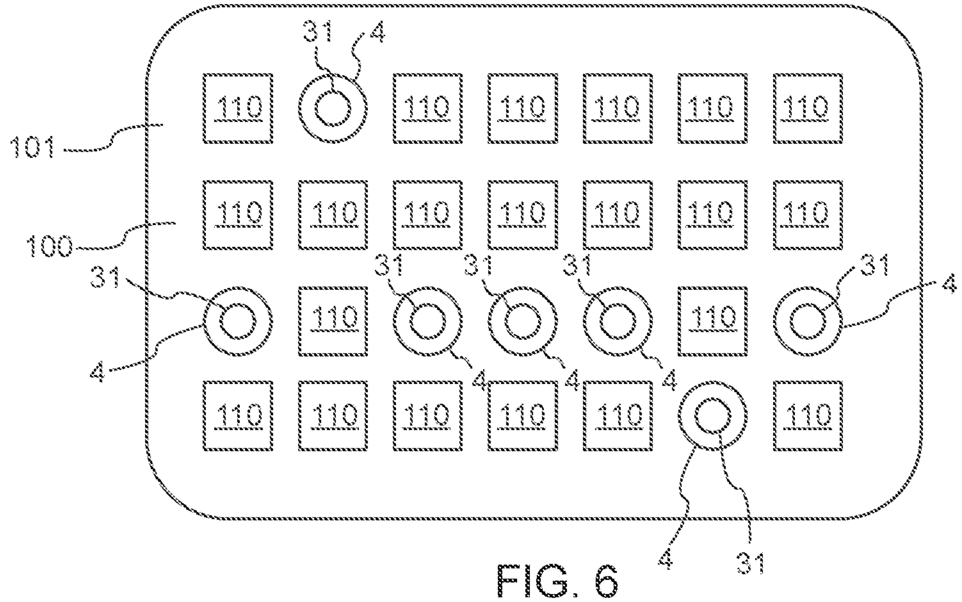
FIG. 6 shows another embodiment of a housing underside to explain some further aspects of the proposed principle.

FIG. 6 shows a corresponding example in which the underside of the housing 101 is divided into a grid of several rows and columns. In each grid field, either a solder area 110 or a solder contact pad 31 with a surrounding non-wettable area 4 is now provided. The arrangement of the solder contact pads 31 can be symmetrical or asymmetrical as shown in FIG. 6. Nevertheless, the subdivision of the underside of the housing into a virtual grid dimension ensures a certain symmetry and, in particular, a more uniform distribution of the solder over the entire surface of the underside of the housing.

Figure 7:
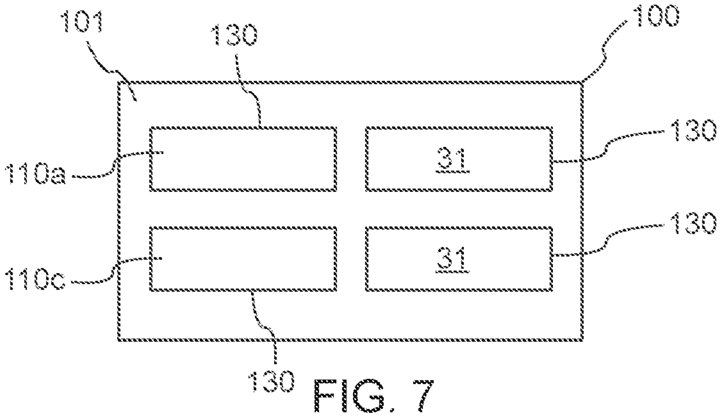
FIG. 7 shows an embodiment of a housing underside according to some further aspects of the proposed principle.

FIG. 7 shows a further embodiment of an electronic assembly in which the solder contact pads 31 and the solder areas 110*a* have the same shape and size. Here, the underside of the housing forms a virtual grid of a 2×2 matrix which, however, comprises a different length and width, i.e. is rectangular in shape. In each grid field, either a solder area 110*a* or a solder contact pad 31 is arranged. Since both surfaces comprise the same shape and size, their position in the grid can be chosen arbitrarily and thus depends on the component located within the housing. The solder areas 110*a* as well as the solder contact pads 31 are each surrounded by a non-wettable border 130. During the soldering process, the solder material remains within the converted areas and is distributed there evenly over the underside of the housing of the component.

Figure 8:
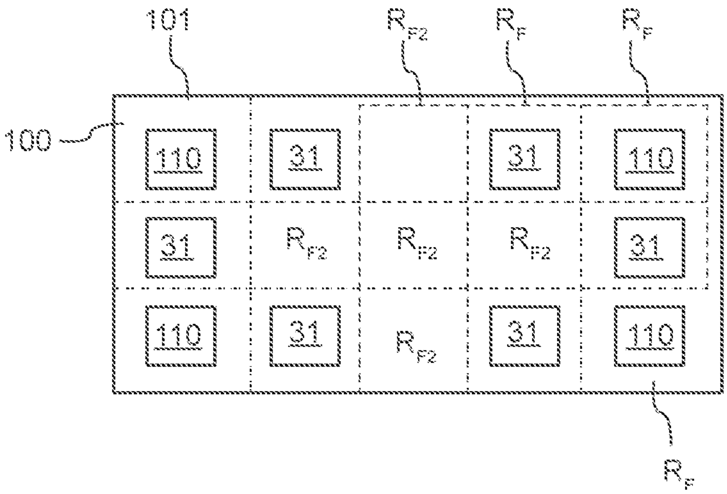
FIG. 8 shows an illustration of an underside of a housing of an electrical assembly to explain some aspects of the proposed principle.

FIG. 8 shows a further embodiment in which the underside of the housing of an assembly is divided into a virtual grid of 5×3 grid fields $R_F$, $R_{F2}$. In this embodiment, however, not all grid fields are occupied by corresponding solder pads or contact areas, but various areas $R_{F2}$ remain free. These are selected so that the grid fields occupied by the solder areas 110 and solder contact pads 31 are distributed as symmetrically as possible with respect to the entire underside of the housing, so that this arrangement prevents the assembly from tilting or floating during the soldering process. In detail, the centrally arranged grid fields $R_{F2}$ and the centrally arranged grid fields $R_{F2}$ are free except for the two outer ends. Solder areas 110 and solder contact pads 31 are provided in the other virtual grid areas. The solder areas 110 as well as solder contact pads are implemented by means of slight elevations, which are applied to the otherwise insulated lower side of the housing 101 by means of an electroplating deposition process. As in the preceding embodiments, it is also possible here. Depending on the application and, in particular, the requirement of the component located inside the housing, to provide a different design of the solder contact pads and a different positioning thereof. Due to the symmetrical design of the solder areas and the solder contact pads as well as their arrangement, which is as uniform as possible, on the basis of a predetermined grid, an approximately symmetrical distribution of the solder material on the underside of the housing is nevertheless achieved.

Figure 9:
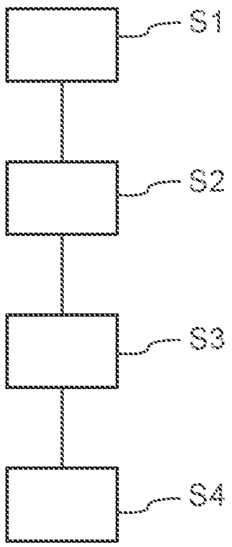
FIG. 9 illustrates various steps of a process for manufacturing an electrical assembly according to the proposed principle.

FIG. 9 shows some process steps for manufacturing an optoelectronic assembly. In step S1, a housing with a flat underside is provided. The bottom side of the housing can already comprise at least two solder contact pads which are arranged on the bottom side of the housing and surrounded by a non-wettable area. In this embodiment, the non-wettable region comprises glass.

For uniform distribution according to the proposed principle, in step S2 the underside of the housing is subdivided into a grid consisting of a plurality of virtual grid fields or subareas, in particular grid fields or subareas of equal size. The subdivision is carried out in such a way that already existing solder contact pads with the surrounding non-wettable area lie in first grid fields.

Subsequently, in step S3, solder areas are generated in second grid fields and these are surrounded by a non-wettable area in step S4. This is done in such a way that the generated solder area and the non-wettable area surrounding the solder area lie within the respective grid field. In this way, grid fields are covered with solder areas and solder contact pads, so that areas to be soldered are essentially uniformly distributed on the underside of the housing.

The invention claimed is:

1. An optoelectronic assembly comprising:

an optoelectronic component with two or more terminal contacts for supply of supply and/or control signals; and a housing base having a planar textured housing underside that comprises, two or more solder contact pads each surrounded by a non-wettable region, the solder contact pads passing through the housing base and being connected to the two or more terminal contacts, and two or more solder areas each enclosed by a non-wettable region, the two or more solder areas being blind areas with no connectivity through the housing;

wherein the two or more solder contact pads and the solder areas are substantially evenly distributed on the underside of the housing.

2. The optoelectronic assembly according to claim 1, wherein the two or more solder contact pads and/or the two or more solder areas each comprise the same size.

3. The optoelectronic assembly according to claim 1; wherein the two or more solder contact pads comprise the same shape, and the two or more solder pads comprise a different shape with respect to the solder contact pads.

4. The optoelectronic assembly according to claim 3, wherein the solder contact pads are round and the solder areas are square.

5. The optoelectronic assembly according to claim 1, in which the housing underside comprises a metallic layer as a heat sink, in particular a metallic block, on which the two or more solder areas are structured.

6. The optoelectronic assembly according to claim 1, wherein the non-wettable regions are formed by a solder resist.

7. The optoelectronic assembly according to claim 1, wherein the non-wettable regions surrounding the solder contact pads are formed by glass.

8. The optoelectronic assembly according to claim 1, wherein the solder area surrounding non-wettable regions is formed by a solder repellent metal.

9. The optoelectronic assembly according to claim 1, in which the solder areas form part of the underside of the housing, and comprise a metal layer, in particular of gold, which can be wetted by solder, the gold layer being removed in the non-wettable regions surrounding the solder areas.

10. The optoelectronic assembly according to claim 1, in which the solder areas each form planar elevations over the underside of the housing, and the non-wettable areas surrounding the solder areas are formed by the edge of the planar elevation, wherein optionally at the edge the metal layer wettable by solder, in particular of gold, is removed.

11. The optoelectronic assembly according claim 10, wherein the planar protrusions are in the range of 50 μm to 500 μm.

12. The optoelectronic assembly according claim 10, wherein the planar protrusions are in the range of 100 μm to 300 μm.

13. The optoelectronic assembly according to claim 1, in which the underside of the housing can be subdivided into a virtual grid of rows and columns, a solder contact pad or a solder area being arranged in a virtual grid field defined by the subdivision, in particular in each defined virtual grid field.

14. The optoelectronic assembly according to claim 13, wherein the virtual raster fields are of equal size.

15. The optoelectronic assembly according to claim 1, wherein an area of the virtual grid array is in the range of from 100% to 175% of the area of the solder area disposed in the virtual grid array and the surrounding non-wettable area or the solder contact pad and the surrounding non-wettable area.

* * * * *